United States Patent
Mizumasa

(10) Patent No.: US 6,901,566 B2
(45) Date of Patent: May 31, 2005

(54) SEMICONDUCTOR INTEGRATED CIRCUIT HAVING A PLURALITY OF CIRCUIT REGIONS WHERE DIFFERENT POWER SUPPLY VOLTAGES ARE USED AND METHOD OF MANUFACTURING THE SAME

(75) Inventor: Tatsuhiro Mizumasa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 97 days.

(21) Appl. No.: 10/098,535

(22) Filed: Mar. 18, 2002

(65) Prior Publication Data

US 2003/0070149 A1 Apr. 10, 2003

(30) Foreign Application Priority Data

Oct. 4, 2001 (JP) .................................. 2001-309053

(51) Int. Cl.$^7$ ............................................. G06F 17/50
(52) U.S. Cl. ............................................................ 716/5
(58) Field of Search ................................ 716/5, 1, 2

(56) References Cited

U.S. PATENT DOCUMENTS

| | | | | |
|---|---|---|---|---|
| 5,972,740 A | * | 10/1999 | Nakamori | 438/129 |
| 5,999,714 A | * | 12/1999 | Conn et al. | 716/2 |
| 6,035,108 A | * | 3/2000 | Kikuchi | 716/2 |
| 6,117,179 A | * | 9/2000 | Tan et al. | 703/14 |
| 6,209,123 B1 | * | 3/2001 | Maziasz et al. | 716/14 |
| 6,370,678 B1 | * | 4/2002 | Culler | 716/18 |
| 6,399,486 B1 | * | 6/2002 | Chen et al. | 438/660 |
| 6,487,706 B1 | * | 11/2002 | Barkley et al. | 716/7 |
| 6,584,608 B1 | * | 6/2003 | Kumada et al. | 716/15 |
| 6,611,045 B2 | * | 8/2003 | Travis et al. | 257/620 |
| 6,732,345 B2 | | 5/2004 | Kato | |
| 2003/0070149 A1 | * | 4/2003 | Mizumasa | 716/5 |

FOREIGN PATENT DOCUMENTS

| | | |
|---|---|---|
| JP | 06-260557 | 9/1994 |
| JP | 11-307639 | 11/1999 |
| JP | 2001-176981 | 6/2001 |

* cited by examiner

*Primary Examiner*—Stacy A. Whitmore
(74) *Attorney, Agent, or Firm*—Westerman, Hattori, Daniels & Adrian, LLP

(57) ABSTRACT

A semiconductor integrated circuit has a first circuit region using a first power supply voltage and a second circuit region using a second power supply voltage different from the first power supply voltage. The first circuit region is manufactured by a first design rule in accordance with the first power supply voltage, and the second circuit region is manufactured by a second design rule in accordance with the second power supply voltage.

22 Claims, 3 Drawing Sheets

SEMICONDUCTOR INTEGRATED CIRCUIT HAVING A PLURALITY OF CIRCUIT REGIONS WHERE DIFFERENT POWER SUPPLY VOLTAGES ARE USED AND METHOD OF MANUFACTURING THE SAME

BACKGROUND OF THE INVENTION

1. Field of the Invention

The present invention relates to a semiconductor integrated circuit and a method of manufacturing the semiconductor integrated circuit, and more particularly, to a semiconductor integrated circuit having a plurality of circuit regions where different power supply voltages are used and a method of manufacturing the same.

2. Description of the Related Art

Recently, greater miniaturization and also high integration have been demanded from a semiconductor integrated circuit, and a plurality of circuit blocks (circuit regions) having various functions have been incorporated to one semiconductor integrated circuit (semiconductor chip).

Specifically, for example, in a semiconductor integrated circuit used for a portable telephone, a high power supply voltage circuit region and some low power supply voltage circuit regions are formed together. The high power supply voltage circuit region, where a high power supply voltage of 3 Volts is used, constitutes an RF (Radio Frequency) power circuit, and the low power supply voltage circuit regions, where a low power supply voltage of 1.2 Volts is used, constitute a memory, a logic circuit, and the like.

Further, the demands of miniaturization and high integration to the semiconductor integrated circuit accelerate the further progress of semiconductor manufacturing processes. Specifically, in recent years, a semiconductor integrated circuit, employing Cu (copper) wiring and design rule of 0.18 $\mu$m or below, have been commercialized.

In a semiconductor integrated circuit, having a plurality of circuit regions where different power supply voltages are used, according to the prior art, the semiconductor integrated circuit is manufactured in accordance with a design rule that applies to a circuit region using the highest power supply voltage, and further, the design rule is determined by using a wide wiring interval margin. Therefore, the occupied area of the semiconductor integrated circuit (semiconductor chip) becomes large.

The prior art and the problem points thereof will be described in detail with reference to the accompanying drawings.

SUMMARY OF THE INVENTION

An object of the present invention is to provide a semiconductor integrated circuit and a method of manufacturing the semiconductor integrated circuit where an occupied area of a semiconductor integrated circuit can be reduced.

According to the present invention, there is provided a method of manufacturing a semiconductor integrated circuit having a first circuit region using a first power supply voltage and a second circuit region using a second power supply voltage different from the first power supply voltage wherein a first design rule is applied to the first circuit region in accordance with the first power supply voltage; and a second design rule is applied to the second circuit region in accordance with the second power supply voltage.

A wiring interval of the first circuit region may be determined as a minimum distance allowing a first breakdown voltage of the first design rule, and a wiring interval of the second circuit region may be determined as a minimum distance allowing a second breakdown voltage of the second design rule. A distance between adjacent two vias formed in the first circuit region may be determined as a minimum distance allowing a first breakdown voltage of the first design rule, and a distance between adjacent two vias formed in the second circuit region may be determined as a minimum distance allowing a second breakdown voltage of the second design rule. The distance between the adjacent two vias formed in the first circuit region may be the shortest distance therebetween, and the distance between the adjacent two vias formed in the second circuit region may be the shortest distance therebetween.

A distance between adjacent wiring groove and via formed in the first circuit region may be determined as a minimum distance allowing a first breakdown voltage of the first design rule, and a distance between adjacent wiring groove and via formed in the second circuit region may be determined as a minimum distance allowing a second breakdown voltage of the second design rule. The distance between the adjacent wiring groove and via formed in the first circuit region may be the shortest distance therebetween, and the distance between the adjacent wiring groove and via formed-in the second circuit region may be the shortest distance therebetween.

Further, according to the present invention, there is also provided a semiconductor integrated circuit having a first circuit region using a first power supply voltage and a second circuit region using a second power supply voltage different from the first power supply voltage wherein the first circuit region is manufactured by a first design rule in accordance with the first power supply voltage; and the second circuit region is manufactured by a second design rule in accordance with the second power supply voltage.

The first circuit region may have a first wiring interval corresponding to a minimum distance allowing a first breakdown voltage of the first design rule, and the second circuit region may have a second wiring interval corresponding to a minimum distance allowing a second breakdown voltage of the second design rule. The first circuit region may have a first distance between adjacent two vias formed in the first circuit region corresponding to a minimum distance allowing a first breakdown voltage of the first design rule, and the second circuit region may have a second distance between adjacent two vias formed in the second circuit region corresponding to a minimum distance allowing a second breakdown voltage of the second design rule. The first distance may be the shortest distance between the adjacent two vias formed in the first circuit region, and the second distance may be the shortest distance between the adjacent two vias formed in the second circuit region.

The first circuit region may have a first distance between adjacent wiring groove and via formed in the first circuit region corresponding to a minimum distance allowing a first breakdown voltage of the first design rule, and the second circuit region may have a second distance between adjacent wiring groove and via formed in the second circuit region corresponding to a minimum distance allowing a second breakdown voltage of the second design rule. The first distance may be the shortest distance between the adjacent wiring groove and via formed in the first circuit region, and the second distance may be the shortest distance between the adjacent wiring groove and via formed in the second circuit region.

The semiconductor integrated circuit may employ a Dual-Damascene process to form metal wirings of the first and second circuit regions. The metal wirings may be copper wirings.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

Before explaining embodiments according to the present invention, a semiconductor integrated circuit according to the prior art and the problems thereof will be explained.

Figure 1:
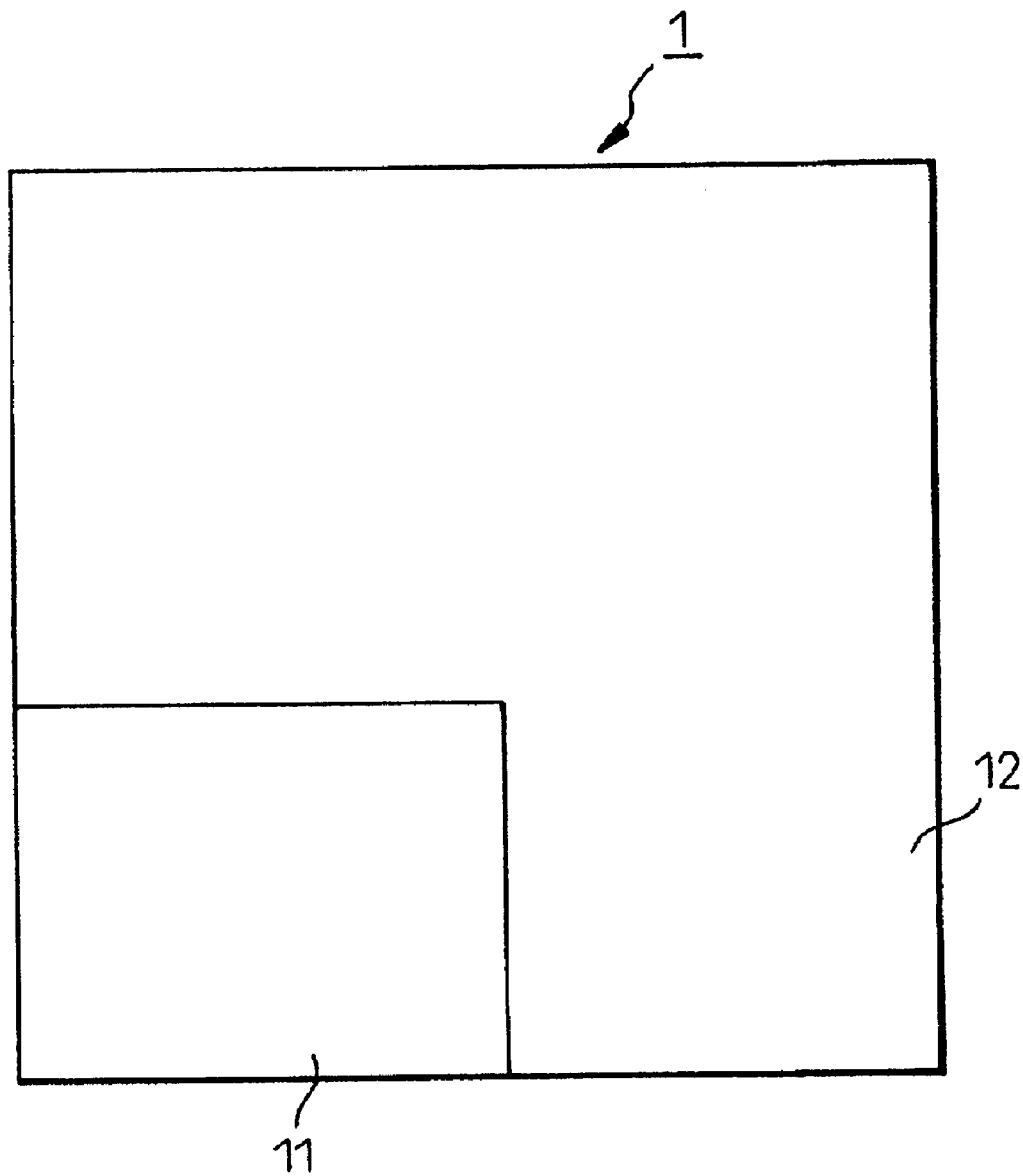
FIG. 1 is a diagram schematically showing an example of a semiconductor integrated circuit, which is a target of the present invention.

FIG. 1 schematically shows an example of a semiconductor integrated circuit (semiconductor chip), which is a target of the present invention. As shown in FIG. 1, the semiconductor integrated circuit 1 comprises a first circuit region 11 and a second circuit region 12.

Specifically, for example, the semiconductor integrated circuit 1 is a semiconductor integrated circuit (IC chip) used for a portable telephone, the first circuit region 11 constitutes an RF power circuit using a high power supply voltage (for example, 3 Volts), and the second circuit region 12 constitutes a memory, a logic circuit, and the like using a low power supply voltage (for example, 1.2 Volts).

In the prior art, the semiconductor integrated circuit shown in FIG. 1, having a plurality of circuit regions where different power supply voltages are used, is manufactured by a single design rule which determines all wiring intervals of all circuit regions as a uniform length according to a breakdown voltage specified by an exposure process, a thickness of an insulation layer, and the like. Specifically, the prior semiconductor integrated circuit is manufactured by a single design rule that applies to a circuit region using the highest power supply voltage.

Figure 2:
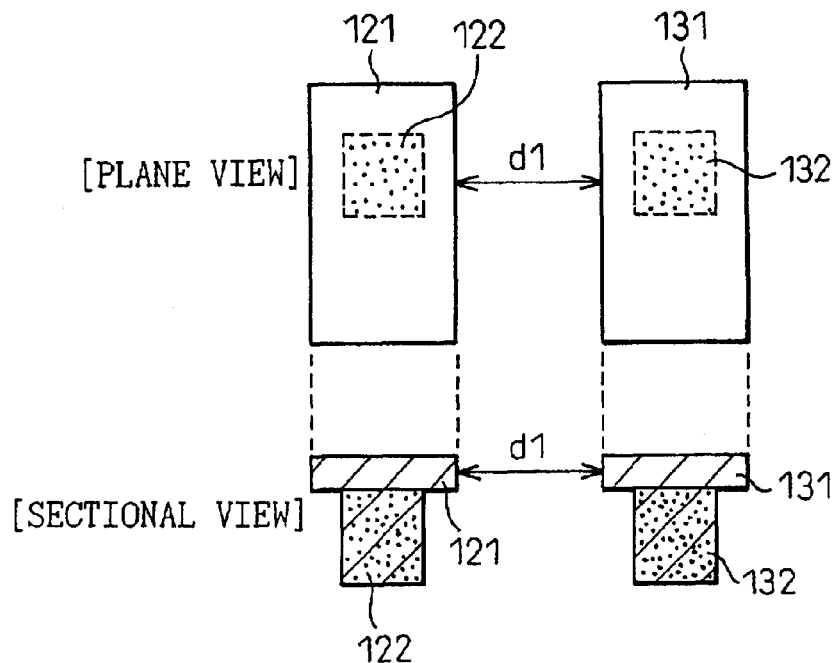
FIG. 2 is a diagram for explaining a Dual-Damascene process carried out in a method of manufacturing a semiconductor integrated circuit.

FIG. 2 is a diagram for explaining a Dual-Damascene process carried out in a method of manufacturing a semiconductor integrated circuit.

As described above, the demands of miniaturization and high integration to the semiconductor integrated circuit accelerate the further progress of semiconductor manufacturing processes, and a semiconductor integrated circuit, employing Cu (copper) wiring and design rule of 0.18 $\mu$m or below, has been commercialized. In such a semiconductor integrated circuit, the copper wiring is generally formed by using a Dual-Damascene process. It is of course that the copper wiring may be formed by a Single-Damascene process.

As shown in FIG. 2, in the Dual-Damascene process of the copper wiring (Dual-Damascene copper wiring), wiring grooves 121, 131 and vias (via holes) 122, 132 for electrically contacting with a lower wiring (lower conductive layer) are formed in an insulation layer film (insulation film between wiring layers), a copper film is simultaneously grown in complex shaped openings formed by the wiring grooves and vias, and then unnecessary copper outside the openings is flatten by using a CMP (Chemical Mechanical Polishing) method, so that a copper wiring is formed. Note that, when an alignment between the wiring grooves 121, 131 and the vias 122, 132 is surely carried out, a design rule is defined that the shortest distance d1 between neighboring wirings (wiring grooves 121 and 131) is at a minimum wiring interval determined by the breakdown voltage.

Figure 3:
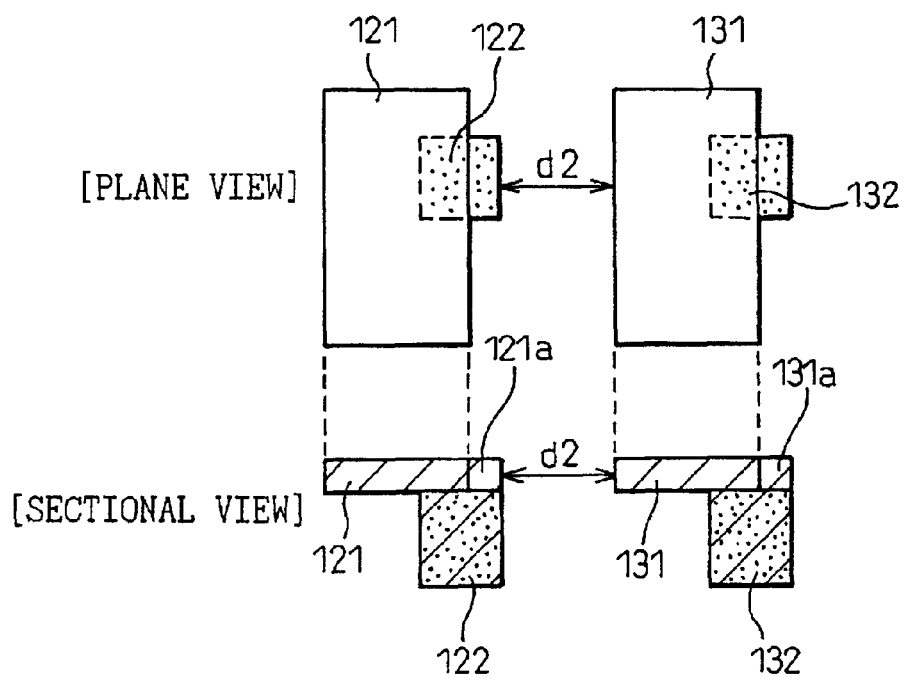
FIG. 3 is a diagram for explaining the case where an alignment error is caused in the Dual-Damascene process according to the prior art.

FIG. 3 is a diagram for explaining the case where an alignment error is caused in the Dual-Damascene process according to the prior art.

As shown in FIG. 3, when an alignment between the wiring grooves 121, 131 and the vias 122, 132 is not surely carried out (when an alignment error is caused), the copper wiring formed by using the Dual-Damascene process in the wiring grooves 121, 131 extends over the vias 122, 132 (alignment error portions 121a, 131a), and the shortest distance d2 between neighboring wirings (wiring grooves 121+121a and 131+131a) becomes shorter than the shortest distance d1 when the alignment is surely carried out. Specifically, in the case that the alignment error is caused, the wiring interval between the neighboring wirings becomes small.

Therefore, in the prior art method of manufacturing a semiconductor integrated circuit, a design rule must be determined by using a wide wiring interval margin which is a sufficient distance between the neighboring wirings even when an alignment error is caused.

As explained above, with reference to FIG. 1, a semiconductor integrated circuit having a plurality of circuit regions where different power supply voltages are used is manufactured by a single design rule that applies to a circuit region using the highest power supply voltage.

Further, as explained above, with reference to FIGS. 2 and 3, in a semiconductor integrated circuit employing a copper wiring formed by using a Dual-Damascene process, a design rule should be determined by using a wide wiring interval margin which is a sufficient distance between the neighboring wirings even when an alignment error is caused and a wiring interval between the neighboring wirings becomes small. Therefore, an occupied area of the prior art semiconductor integrated circuit becomes large.

The preferred embodiments of a semiconductor integrated circuit and a method of manufacturing the semiconductor integrated circuit according to the present invention will be described in detail below with reference to the accompanying drawings.

The semiconductor integrated circuit, which is the target of the present invention, is a semiconductor integrated circuit (semiconductor chip) 1 having a plurality of circuit regions using different power supply voltages as shown in FIG. 1, which is, for example, used for a portable telephone. The semiconductor integrated circuit (IC chip) 1 comprises a first circuit region 11 constituting an RF power circuit using a high power supply voltage (for example, 3 Volts), and a second circuit region 12 constituting a memory, a logic circuit, and the like using a low power supply voltage (for example, 1.2 Volts).

A first design rule used for manufacturing the first circuit region 11 is determined as a design rule where a wiring interval is, for example, X $\mu$m suitable for using the high power supply voltage (for example, 3 Volts), and a second design rule used for manufacturing the second circuit region 12 is determined as a design rule where a wiring interval is, for example, Y $\mu$m (where, X>Y) suitable for using the low power supply voltage (for example, 1.2 Volts). Specifically, in the present invention, the semiconductor integrated circuit having a plurality of circuit regions where different power supply voltages are used is manufactured by a single design rule, but the semiconductor integrated circuit is manufactured by a plurality of design rules corresponding to the plurality of circuit areas using different power supply voltages. Concretely, the semiconductor integrated circuit is not manufactured by a first design rule for manufacturing a first circuit region 11 using the high power supply voltage (3 Volts) and a second design rule for manufacturing a second circuit region 12 using the low power supply voltage (1.2 Volts).

In the prior art, the semiconductor integrated circuit having a plurality of circuit regions where different power supply voltages are used, is manufactured by a single design rule (first design rule used for the first circuit region 11 using the high power supply voltage), and therefore, an occupied area of the second circuit region 12 is uselessly increased.

On the other hand, in the present invention, the semiconductor integrated circuit having a plurality of circuit regions where different power supply voltages are used, is manufactured by a plurality of design rules (for example, two design rules) suitable for circuit regions using different power supply voltages. Specifically, in an embodiment of the semiconductor integrated circuit according to the present invention, the first circuit region 11 is manufactured by using the first design rule (for example, long wiring interval of X $\mu$m) suitable for a circuit region using a high power supply voltage (for example, 3 Volts), and the second circuit region 12 is manufactured by using the second design rule (for example, short wiring interval of Y $\mu$m) suitable for a circuit region using a low power supply voltage (for example, 1.2 Volts). Therefore, an occupied area of the second circuit region 12 does not become uselessly large, and thus an occupied area of the semiconductor integrated circuit does not become uselessly large. Consequently, by comparing the semiconductor integrated circuit of the present invention with that of the prior art, the semiconductor integrated circuit can be manufactured with a small occupied area.

In the above description, the number of circuit regions using different power supply voltages and the number of design rules corresponding to the circuit regions is not limit to two (for 3 Volts and 1.2 Volts).

Figure 4:
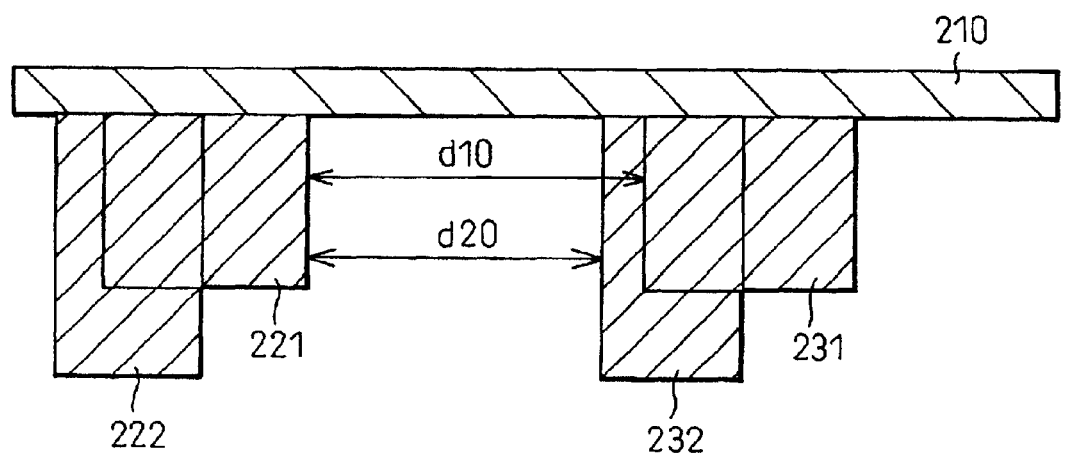
FIG. 4 is a diagram for explaining the case where an alignment error is caused in the Dual-Damascene process according to the present invention.

FIG. 4 is a diagram for explaining the case where an alignment error is caused in the Dual-Damascene process according to the present invention. In FIG. 4, reference numeral 210 denotes an insulation film such as a silicon oxide film, silicon nitride film, or the like; 221, 231 denote wiring grooves; and 222, 232 denote vias (via holes).

In the semiconductor integrated circuit of the present embodiment, a distance (the shortest distance) d10 between the wiring grooves 221 and 231 is determined as a minimum distance allowing a first breakdown voltage of a first design rule, and a distance (the shortest distance) d10 between the wiring grooves 221 and 231 is determined as a minimum distance allowing a second breakdown voltage of a second design rule.

Further, so as to reduce an occupied area of the semiconductor integrated circuit much more, a distance (the shortest distance) d20 between the wiring groove 221 and the via 232 is determined as the minimum distance allowing the first breakdown voltage of the first design rule, and a distance (the shortest distance) d20 between the wiring grooves 221 and the via 232 is determined as the minimum distance allowing the second breakdown voltage of the second design rule. Specifically, in the Dual-Damascene process, the vias 222, 232 are filled with metal (copper) up to a surface, and the wiring interval for compensating for the breakdown voltage between the wirings becomes the distance d20 determined by the wiring (wiring groove) 221 and the via 232, when an alignment error (positioning error of the vias 222, 232 to the wirings 221, 231) occurs. Therefore, a distance between adjacent wiring groove (221) and via (232) formed in the first circuit region (11) is determined as a minimum distance allowing the first design rule (the first breakdown voltage of the first design rule), and a distance between adjacent wiring groove (221) and via (232) formed in the second circuit region is determined as a minimum distance allowing the second design rule (the second breakdown voltage of the second design rule).

When setting design rules for circuit regions of a semiconductor integrated circuit, elements that are used for the circuit regions are divided into high voltage elements (provided for a circuit region using a high power supply voltage) and standard elements (provided for a circuit region using a low (standard) power supply voltage) according to mask series used for the layout of the semiconductor integrated circuit. The checking method is established by a first checking to check wirings connected to the high voltage elements by considering a specific voltage margin and a second checking to check wirings connected to the standard elements by checking a standard wiring interval. Therefore, the setting of the design rules that are divided into high voltage wirings and low (standard) voltage wirings becomes possible.

As described above, according to a semiconductor integrated circuit and a method of manufacturing the same according to the present invention, an occupied area of a semiconductor integrated circuit (semiconductor chip) having a plurality of circuit regions, where different power supply voltages are used, can be reduced.

Many different embodiments of the present invention may be constructed without departing from the spirit and scope of the present invention, and it should be understood that the present invention is not limited to the specific embodiments described in this specification, except as defined in the appended claims.

What is claimed is:

1. A method of manufacturing a semiconductor integrated circuit having a first circuit region using a first power supply voltage and a second circuit region using a second power supply voltage different from said first power supply voltage wherein:

a first design rule is applied to said first circuit region in accordance with said first power supply voltage; and a second design rule is applied to said second circuit region in accordance with said second power supply voltage;

wherein a wiring interval of said first circuit region is determined as a minimum distance allowing a first breakdown voltage of said first design rule; and wherein a wiring interval of said second circuit region is determined as a minimum distance allowing a second breakdown voltage of said second design rule.

2. The method of manufacturing the semiconductor integrated circuit as claimed in claim 1, wherein said semiconductor integrated circuit employs a Dual-Damascene process to form metal wirings of said first and second circuit regions.

3. The method of manufacturing the semiconductor integrated circuit as claimed in claim 2, wherein said metal wirings are copper wirings.

4. A method of manufacturing a semiconduotor intergrated circuit having a first circuit region using a first power supply voltage and a second circuit region using a second power supply voltage different from said first power supply voltage wherein:
   a first design rule is applied to said first circuit region in accordance with said first power supply voltage; and
   a second design rule is applied to said second circuit region in accordance with said second power supply voltage;
   wherein a distance between adjacent two vias formed in said first circuit region is determined as a minimum distance allowing a first breakdown voltage of said first design rule; and
   wherein a distance between adjacent two vias formed in said second circuit region is determined as a minimum distance allowing a second breakdown voltage of said second design rule.

5. The method of manufacturing the semiconductor integrated circuit as claimed in claim 4, wherein:
   said distance between the adjacent two vias formed in said first circuit region is the shortest distance therebetween; and
   said distance between the adjacent two vias formed in said second circuit region is the shortest distance therebetween.

6. The method of manufacturing the semiconductor integrated circuit as claimed in claim 4, wherein said semiconductor integrated circuit employs a Dual-Damascene process to form metal wirings of said first and second circuits.

7. The method of manufacturing the semiconductor integrated circuit as claimed in claim 6, wherein said metal wirings are copper wirings.

8. A method of manufacturing a semiconductor integrated circuit having a first circuit region using a first power supply voltage and a second circuit region using a second power supply voltage different from said first power supply voltage wherein:
   a first design rule is applied to said first circuit region in accordance with said first power supply voltage; and
   a second design rule is applied to said second circuit region in accordance with said second power supply voltage;
   wherein a distance between adjacent wiring groove and via formed in said first circuit region is determined as a minimum distance allowing a first breakdown voltage of said first design rule; and
   wherein a distance between adjacent wiring groove and via formed in said second circuit region is determined as a minimum distance allowing a second breakdown voltage of said second design rule.

9. The method of manufacturing the semiconductor integrated circuit as claimed in claim 8, wherein:
   said distance between the adjacent wiring groove and via formed in said first circuit region is the shortest distance therebetween; and
   said distance between the adjacent wiring groove and via formed in said second circuit region is the shortest distance therebetween.

10. The method of manufacturing the semiconductor integrated circuit as claimed in claim 8, wherein said semiconductor integrated circuit employs a Dual-Damascene process to form metal wirings of said first and second circuit regions.

11. The method of manufacturing the semiconductor integrated circuit as claimed in claim 10, wherein said metal wirings are copper wirings.

12. A semiconductor integrated circuit having a first circuit region using a first power supply voltage and a second circuit region using a second power supply voltage different from said first power supply voltage wherein:
   said first circuit region is manufactured by a first design rule in accordance with said first power supply voltage; and
   said second circuit region is manufactured by a second design rule in accordance with said second power supply voltage;
   wherein said first circuit region has a first wiring interval corresponding to a minimum distance allowing a first breakdown voltage of said first design rule; and
   wherein said second circuit region has a second wiring interval corresponding to a minimum distance allowing a second breakdown voltage of said second design rule.

13. The semiconductor integrated circuit as claimed in claim 12, wherein said semiconductor integrated circuit employs a Dual-Damascene process to form metal wirings of said first and second circuit regions.

14. The semiconductor integrated circuit as claimed in claim 13, wherein said metal wirings are copper wirings.

15. A semiconductor integrated circuit having a first circuit region using a first power supply voltage and a second circuit region using a second power supply voltage different from said first power supply voltage wherein:
   said first circuit region is manufactured by a first design rule in accordance with said first power supply voltage; and
   said second circuit region is manufactured by a second design rule in accordance with said second power supply voltage;
   wherein said first circuit region has a first distance between adjacent two vias formed in said first circuit region corresponding to a minimum distance allowing a first breakdown voltage of said first design rule; and
   wherein said second circuit region has a second distance between adjacent two vias formed in said second circuit region corresponding to a minimum distance allowing a second breakdown voltage of said second design rule.

16. The semiconductor integrated circuit as claimed in claim 15, wherein:
   said first distance is the shortest distance between the adjacent two vias formed in said first circuit region; and
   said second distance is the shortest distance between the adjacent two vias formed in said second circuit region.

17. The semiconductor integrated circuit as claimed in claim 15, wherein said semiconductor integrated circuit employs a Dual-Damascene process to form metal wirings of said first and second circuit regions.

18. The asemiconductor integrated circuit as claimed in claim 17, wherein said metal wirings are copper wirings.

19. A semiconductor integrated circuit having a first circuit region using a first power supply voltage and a second circuit region using a second power supply voltage different from said first power supply voltage wherein:
   said first circuit region is manufactured by a first design rule in accordance with said first power supply voltage; and
   said second circuit region is manufactured by a second design rule in accordance with said second power supply voltage;
   wherein said first circuit region has a first distance between adjacent wiring groove and via formed in said first circuit region corresponding to a minimum distance allowing a first breakdown voltage of said first design rule; and wherein said second circuit region has a second distance between adjacent wiring groove and via formed in said second circuit region corresponding to a minimum distance allowing a second breakdown voltage of said second design rule.

20. The semiconductor integrated circuit as claimed in claim 19, wherein:

said first distance is the shortest distance between the adjacent wiring groove and via formed in said first circuit region; and said second distance is the shortest distance between the adjacent wiring groove and via formed in said second circuit region.

21. The semiconductor integrated circuit as claimed in claim 19, wherein said semiconductor integrated circuit employs a Dual-Damascene process to form metal wirings of said first and second circuit regions.

22. The semiconductor integrated circuit as claimed in claim 21, wherein said metal wirings are copper wirings.

* * * * *